United States Patent
Kuo et al.

(10) Patent No.: US 7,839,219 B2
(45) Date of Patent: Nov. 23, 2010

(54) LOW-NOISE AMPLIFIER CIRCUIT INCLUDING BAND-STOP FILTER

(75) Inventors: Ming-Ching Kuo, Hsinchu (TW); Shiau-Wen Kao, Hsinchu (TW); Chih-Hung Chen, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 2 days.

(21) Appl. No.: 12/188,276

(22) Filed: Aug. 8, 2008

(65) Prior Publication Data

US 2009/0108944 A1 Apr. 30, 2009

Related U.S. Application Data

(60) Provisional application No. 60/960,982, filed on Oct. 24, 2007.

(51) Int. Cl.
*H03F 3/04* (2006.01)

(52) U.S. Cl. .................. 330/301; 330/306; 330/311
(58) Field of Classification Search ............ 330/277, 330/301, 306, 311
See application file for complete search history.

(56) References Cited

U.S. PATENT DOCUMENTS

| | | | |
|---|---|---|---|
| 5,191,338 A * | 3/1993 | Katz et al. | 330/284 |
| 5,221,908 A * | 6/1993 | Katz et al. | 330/277 |
| 6,515,547 B2 * | 2/2003 | Sowlati | 330/311 |
| 6,559,723 B2 * | 5/2003 | Hollenbeck et al. | 330/301 |
| 6,608,527 B2 * | 8/2003 | Moloudi et al. | 330/301 |
| 6,724,253 B2 | 4/2004 | Hau et al. | |
| 7,414,481 B2 * | 8/2008 | Li et al. | 330/311 |

* cited by examiner

*Primary Examiner*—Khanh V Nguyen
(74) *Attorney, Agent, or Firm*—Finnegan, Henderson, Farabow, Garrett & Dunner, LLP

(57) ABSTRACT

A low-noise amplifier circuit includes a MOS transistor in a common gate amplifier configuration. A single-ended input is at a source of the MOS transistor. A resonant cavity filter circuit is coupled to a gate of the MOS transistor.

22 Claims, 8 Drawing Sheets

LOW-NOISE AMPLIFIER CIRCUIT INCLUDING BAND-STOP FILTER

RELATED APPLICATIONS

This application claims priority of U.S. Provisional Patent Application No. 60/960,982 filed Oct. 24, 2007, the contents of which are incorporated herein by reference. This application is related to application Ser. No. 12/188,280, now U.S. Pat. No. 7,671,686.

FIELD OF THE INVENTION

Systems, circuits, and methods disclosed herein relate to amplifier circuits, and, more particularly, to low-noise amplifier circuits.

DESCRIPTION OF THE RELATED ART

Spectrums designated by new standards and norms for wireless communications are becoming increasingly broad. For example, ultra-wide band technology (UWB) utilizes the 3.1~10.6 GHz band range, where there is a triple highest/lowest band ratio; Digital Video Broadcasting-Handheld (DVB-H) utilizes the 474~862 MHz band range, where there is a nearly double highest/lowest band ratio; and Digital Video Broadcasting-Terrestrial (DVB-T) utilizes the 50~850 MHz band range, where there is a 17-fold highest/lowest band ratio.

Broadband communications present substantial challenges for RF receiver design that are not presented by narrowband communications such as Global System for Mobile Communications (GSM) and Wideband Code Division Multiple Access (W-CDMA). The probability of adjacent channel interference grows as the receive band becomes wider, making it more difficult for receivers to ensure an acceptable quality of reception of each communication channel within the band. New standards for spectrum allocation may overlap or be relatively near the spectrum of existing communications standards. When several standards with overlapping spectra are applied in the same platform environment, particularly in circumstances when different systems respectively associated with different standards may be in operation at the same time, receivers may face interference problems.

To ensure more reliable system operation, an external RF filter can be added at the front end of a receiver to suppress the strength of out-of-band interfering signals in order to avoid affecting signal reception sensitivity.

FIG. 1A shows a conventional common gate amplifier 100 with an input 102 and an MOS transistor 104 that includes a gate 106. Gate 106 of transistor 104 is coupled directly to a ground terminal 108. Common gate amplifier 100 may receive on input 102 an input voltage signal Vin to be amplified, and provide an amplified signal on an output 110. Coupling gate 106 directly to ground 108 may provide a flat gain over a broadband frequency

SUMMARY OF THE INVENTION

In accordance with the present invention, there is provided a low-noise amplifier circuit, comprising: a MOS transistor in a common gate amplifier configuration; the MOS transistor having a body, gate, source, and drain, the source and the drain of the MOS transistor serving as a single-ended input and a single-ended output, respectively, of the low noise amplifier circuit; and a resonant cavity filter circuit coupled to the gate of the MOS transistor.

Also in accordance with the present invention, there is provided a low-noise amplifier circuit to convert a single-ended input into a dual-ended output, comprising: a first amplifier circuit, including a first MOS transistor in a common gate amplifier configuration coupled in parallel with a second MOS transistor; a second amplifier circuit, including a third MOS transistor coupled in parallel with a fourth MOS transistor; each of the first, second, third, and fourth transistors having a body, gate, source, and drain; the first amplifier circuit and the second amplifier circuit being cascode coupled to form a cascode amplifier configuration; the single-ended input being at the source of the first transistor; the dual-ended output being a differential output across the drain of the third transistor and the drain of the fourth transistor; and a resonant cavity filter circuit coupled to the gate of the first transistor.

Also in accordance with the present invention, there is provided a low-noise amplifier circuit to convert a single-ended input into a dual-ended output, comprising: a first amplifier circuit, including a first MOS transistor in a common gate amplifier configuration coupled in parallel with a second MOS transistor; a second amplifier circuit, including a third MOS transistor coupled in parallel with a fourth MOS transistor; each of the first, second, third, and fourth transistors having a body, gate, source, and drain; the first amplifier circuit and the second amplifier circuit being cascode coupled to form a cascode amplifier configuration; the single-ended input being at the source of the first transistor; the dual-ended output being a differential output across the drain of the third transistor and the drain of the fourth transistor; the first and second transistors of the first amplifier circuit being cross-coupled, wherein the body of the first transistor is coupled to the source of the second transistor, and the body of the second transistor is coupled to the source of the first transistor; and a resonant cavity filter circuit coupled to the gate of the first transistor.

Additional features and advantages of the invention will be set forth in the description that follows, being apparent from the description or learned by practice of embodiments of the invention. The features and other advantages of the invention will be realized and attained by the low-noise amplifier circuit designs pointed out in the written description and claims, as well as the appended drawings.

It is to be understood that both the foregoing general description and the following detailed description are exemplary and explanatory, and are intended to provide further explanation of the invention as claimed.

DESCRIPTION OF EMBODIMENTS

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments consistent with the present invention do not represent all implementations consistent with the invention. Instead, they are merely examples of systems and methods consistent with aspects related to the invention as recited in the appended claims.

To relax the rejection requirements of RF filters and the linearity requirements of RF front-end circuits, embodiments consistent with the invention are directed to a low-noise amplifier including a band-stop filter. An on-chip RF filter can improve the robustness of a receiver to interference. The function of filtering out interfering signals can be integrated into the low-noise amplifier circuit. This integration can improve reliable receiver operation, reduce rejection requirements of external RF filters, and reduce a bill-of-materials for low-noise amplifier circuits.

Figure 1A:
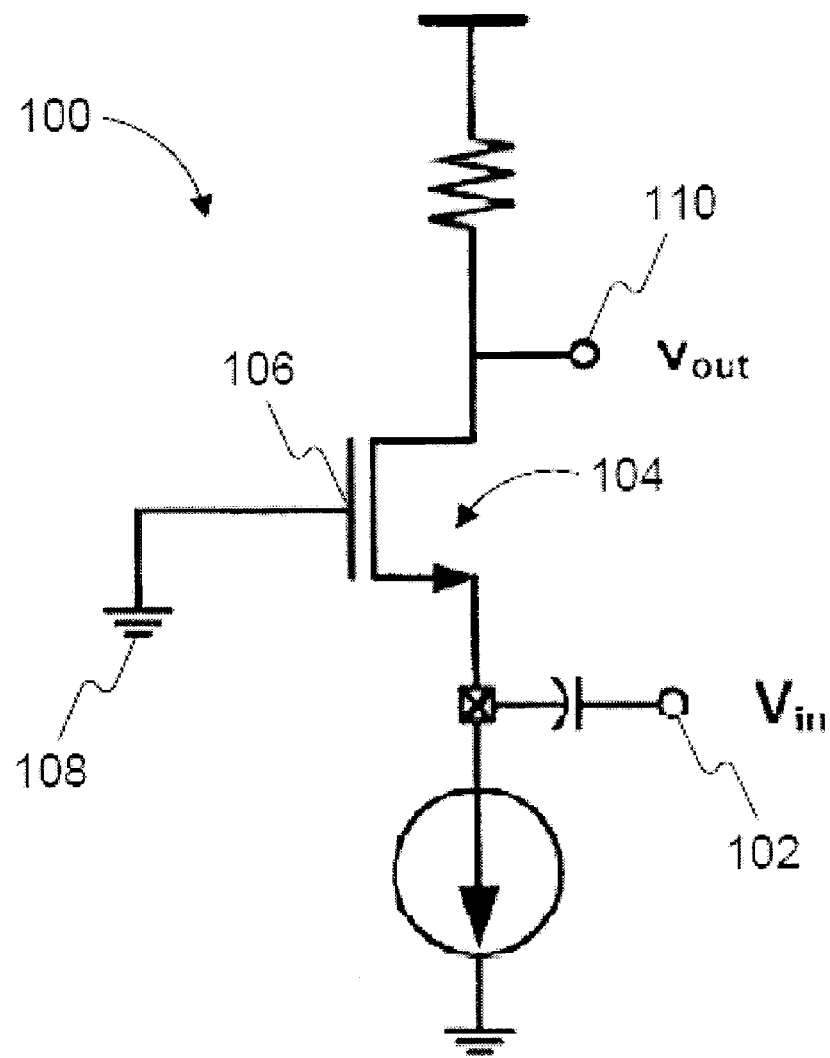
FIG. 1A shows a conventional common gate amplifier including a gate node coupled to a ground terminal.
Figure 1B:
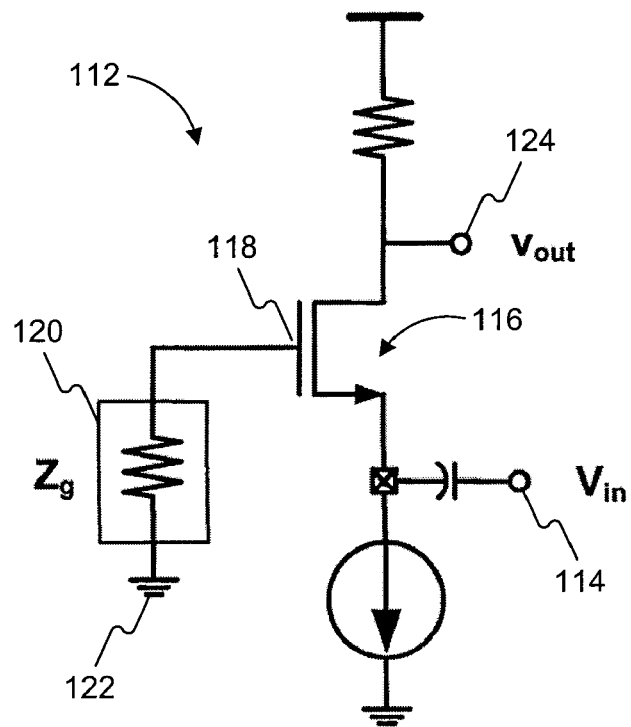
FIG. 1B shows a common gate amplifier including a resistance at a gate node.

FIG. 1B shows a common gate amplifier 112 with an input 114 and an MOS transistor 116 that includes a gate 118. A passive component, such as a resistance $Z_g$ 120, is coupled between gate 118 of transistor 116 and a ground terminal 122. Common gate amplifier 112 may receive on input 114 an input voltage signal Vin to be amplified, and provide an amplified signal $V_{out}$ on an output 124. Resistance 120 coupled as illustrated in common gate amplifier 112 can act as a band-stop filter. Coupling of resistance 120 to gate 118 and choosing an appropriate value for resistance 120 sets a specific frequency at which a gain notch will occur in common gate amplifier 112. A value for resistance 120 can be selected so that the gain notch occurs at a specific frequency where interference is located.

Figure 1C:
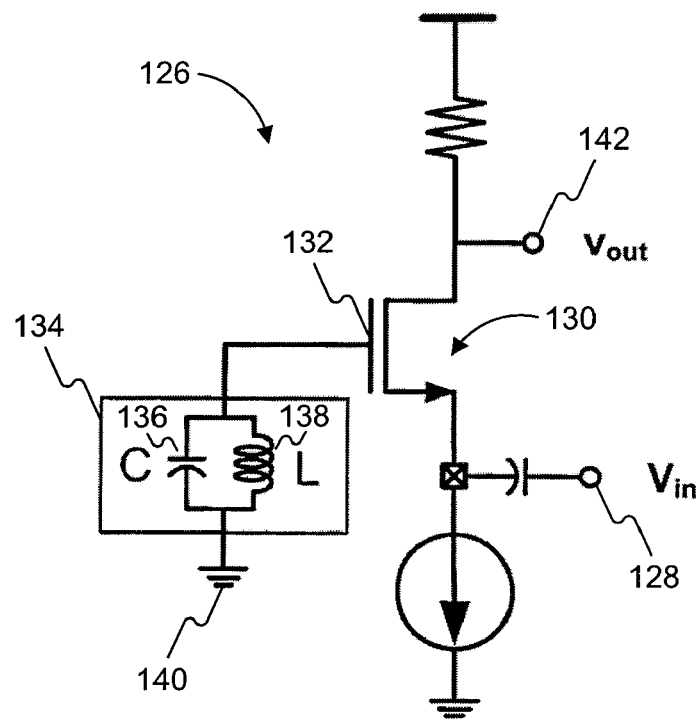
FIG. 1C shows a common gate amplifier including a resonant cavity filter circuit at a gate node consistent with embodiments of the invention.

FIG. 1C shows a common gate amplifier 126 with an input 128 and an MOS transistor 130 that includes a gate 132. A resonant cavity filter circuit 134 is coupled between gate 132 of transistor 130 and a ground terminal 140. Resonant cavity filter circuit 134 may, for example, include a capacitance 136 coupled in parallel with an inductance 138. Common gate amplifier 126 may receive on input 128 an input voltage signal Vin to be amplified, and provide an amplified signal $V_{out}$ on an output 142. Resonant cavity filter circuit 134 coupled as illustrated in common gate amplifier 126 can act as a band-stop filter.

Coupling of resonant cavity filter circuit 134 to gate 132 of transistor 130 and choosing appropriate values for capacitance 136 and inductance 138, sets a specific frequency at which a gain notch will occur in common gate amplifier 126. Equation (1) below shows the relationship between the values of capacitance 136 and inductance 138 and a frequency $f_{notch}$ at which a gain notch will occur. Values for capacitance 136 and inductance 138 can be selected so that the gain notch occurs at a specific frequency where interference is located.

$$f_{notch} = \frac{1}{\sqrt{LC}} \quad (1)$$

Figure 2A:
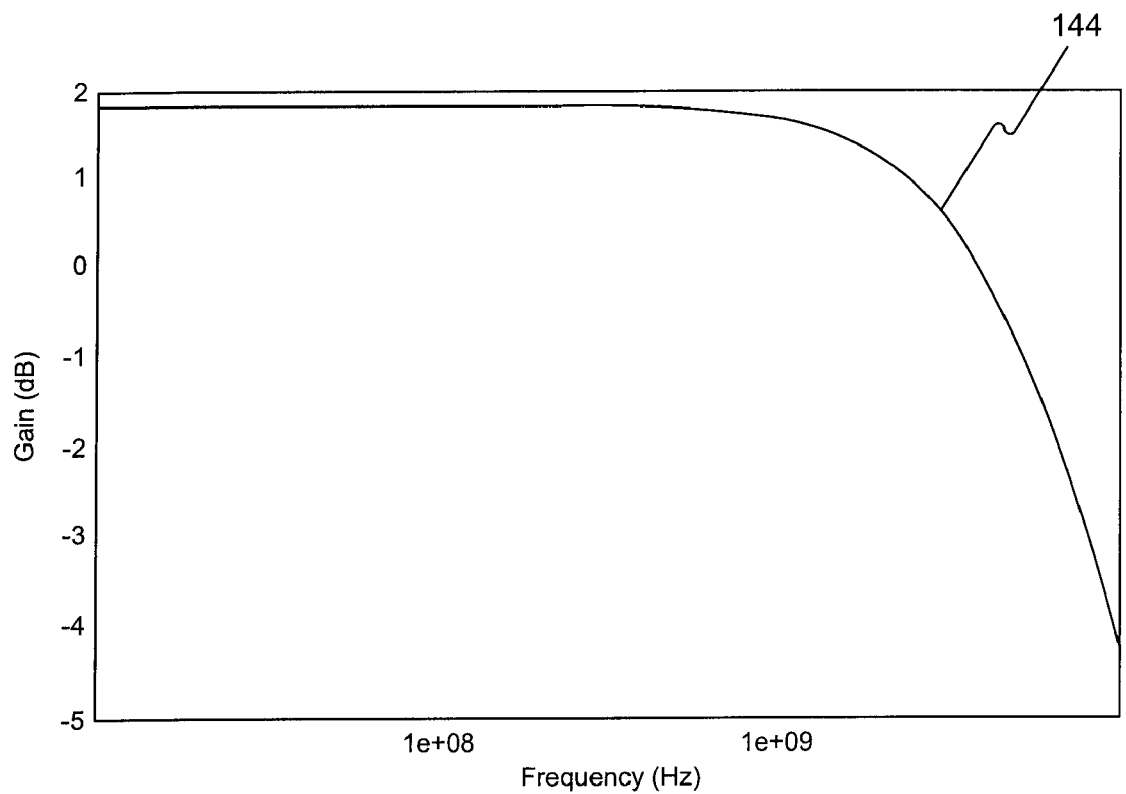
FIG. 2A shows a plot of voltage gain vs. input frequency representing voltage conversion gain of the conventional common gate amplifier shown in FIG. 1A.

FIG. 2A is a plot of voltage gain vs. input frequency for common gate amplifier 100 shown in FIG. 1A. FIG. 2A illustrates a voltage conversion gain curve 144 demonstrating flat gain over a broad frequency range.

Figure 2B:
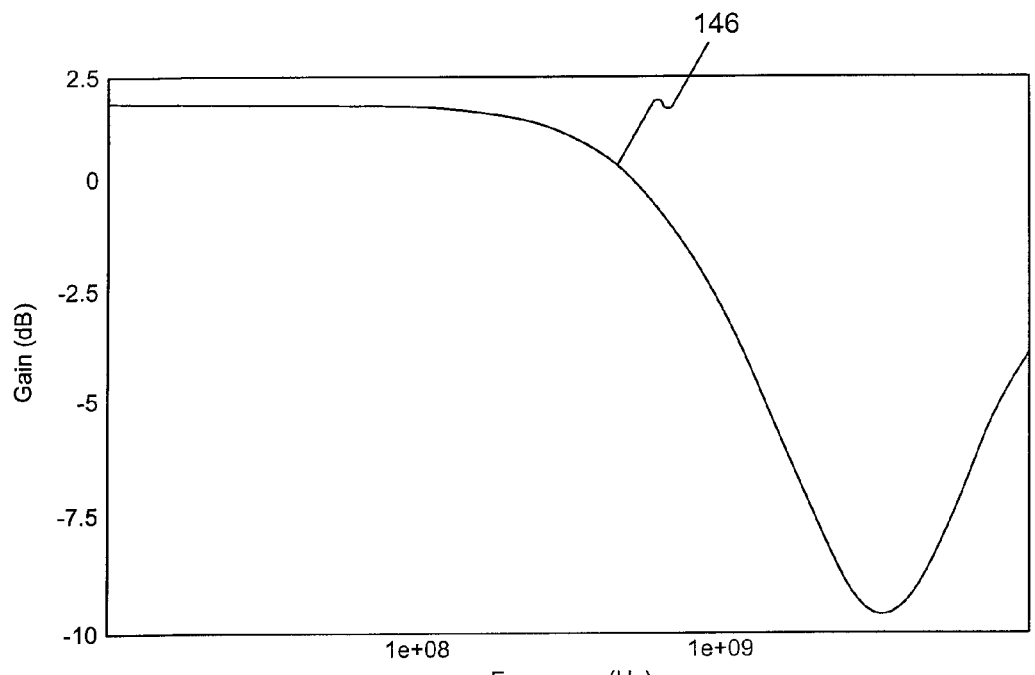
FIG. 2B shows a plot of voltage gain vs. input frequency representing voltage conversion gain of the common gate amplifier shown in FIG. 1B.

FIG. 2B is a plot of voltage gain vs. input frequency for common gate amplifier 112 shown in FIG. 1B. FIG. 2B illustrates a voltage conversion gain curve 146 with a gain notch at a specific frequency. Voltage conversion gain curve 146 illustrates an example in which the gain notch occurs where a frequency of the voltage signal Vin received on input 114 approaches 10 GHz. As shown by voltage conversion gain curve 146, however, the gain notch achieved by a passive component, such as resistance 120, may not be sharp enough to limit rejection of interference to a range close to the desired signal.

Figure 2C:
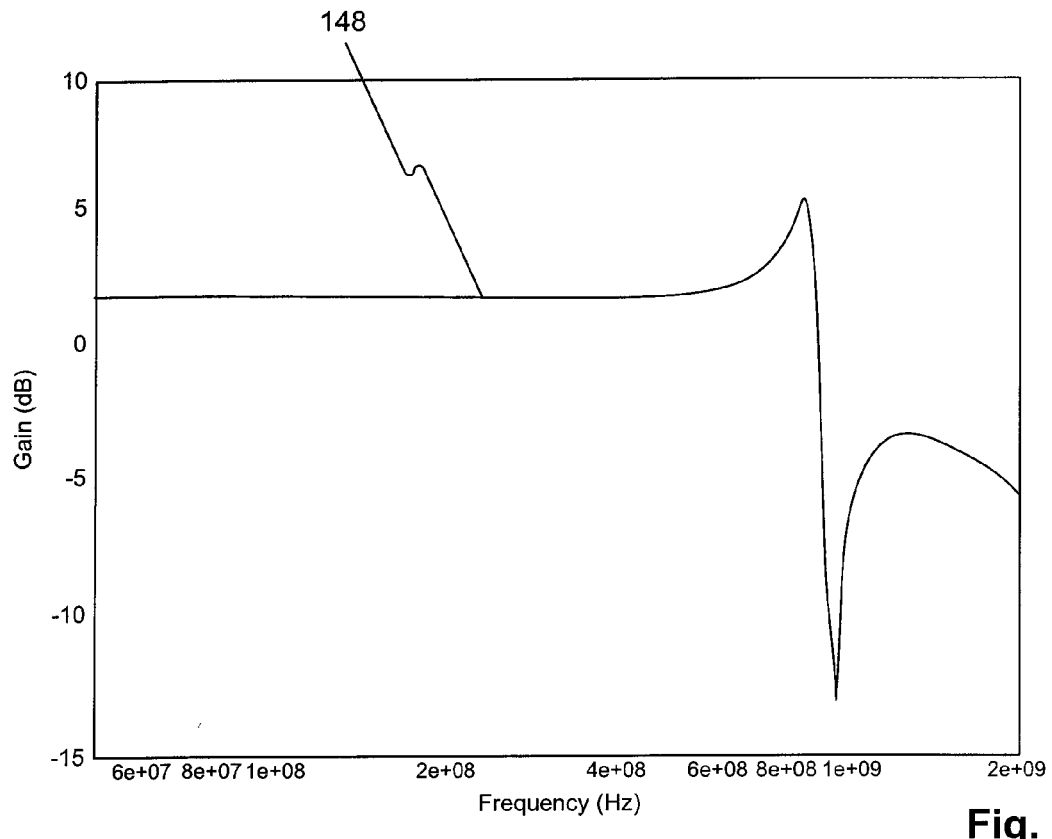
FIG. 2C shows a plot of voltage gain vs. input frequency representing voltage conversion gain of the common gate amplifier shown in FIG. 1C.

FIG. 2C is a plot of voltage gain vs. input frequency for common gate amplifier 126 shown in FIG. 1C. FIG. 2C illustrates a voltage conversion gain curve 148 with a gain notch at a specific frequency. Voltage conversion gain curve 148 illustrates an example where a notch occurs when a frequency of the voltage signal Vin received on input 128 approaches 1 GHz, while the frequency response below about 700 MHz is constant. As shown by comparing voltage conversion gain curves 148 and 146, the gain notch achieved by the common gate amplifier 126 using resonant cavity filter circuit 134 can be much sharper than the gain notch achieved by the common gate amplifier 112 using resistance 120.

Figure 3A:
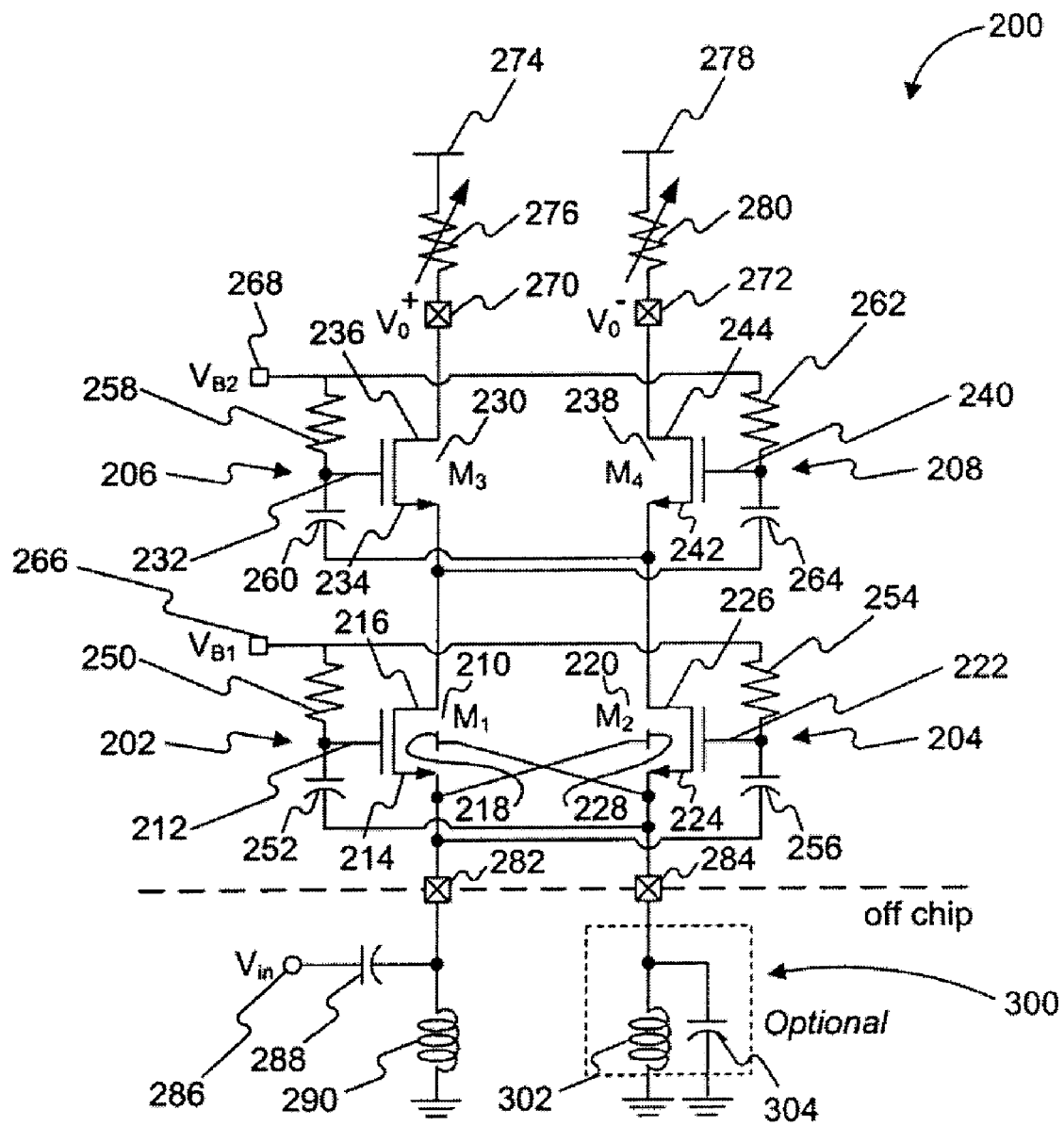
FIG. 3A shows a low-noise amplifier circuit consistent with embodiments of the invention.

FIG. 3A shows a low-noise amplifier circuit 200 consistent with embodiments of the invention. Amplifier circuit 200 includes a common gate amplifier circuit 202 coupled in parallel with a common source amplifier circuit 204. Amplifier circuit 202 includes an MOS transistor M1 210 including a gate 212, a source 214, and a drain 216. Transistor M1 210 also includes a substrate terminal 218. Amplifier circuit 204 includes an MOS transistor M2 220, including a gate 222, a source 224, and a drain 226. Transistor M2 220 also includes a substrate terminal 228.

Low-noise amplifier circuit 200 also includes an amplifier circuit 206 and an amplifier circuit 208. Amplifier circuit 206 includes an MOS transistor M3 230 including a gate 232, a source 234, and drain 236. Amplifier circuit 208 includes an MOS transistor M4 238 including a gate 240, a source 242, and a drain 244.

Amplifier circuit 202 also includes a resistor 250 and a capacitor 252, respective first ends of which are coupled together and to gate 212 of MOS transistor M1 210. Amplifier circuit 204 further includes a resistor 254 and a capacitor 256, respective first ends of which are coupled together and to gate 222 of MOS transistor M2 220. Amplifier circuit 206 further includes a resistor 258 and a capacitor 260, respective first ends of which are coupled together and to gate 232 of MOS transistor M3 230. Amplifier circuit 208 includes a resistor 262 and a capacitor 264, respective first ends of which are coupled together and to gate 240 of MOS transistor M4 238.

Common gate amplifier circuit 202 is cascode coupled to amplifier circuit 206 by coupling drain 216 of MOS transistor M1 210 to source 234 of MOS transistor M3 230. Common source amplifier circuit 204 is cascode coupled to amplifier circuit 208 by coupling drain 226 of MOS transistor M2 220 to source 242 of MOS transistor M4 238.

Low noise amplifier circuit 200 also includes bias voltage terminals 266 and 268 for respectively receiving bias voltages VB1 and VB2. Bias voltage terminal 266 is coupled to respective second ends of resistors 250 and 254. Bias voltage terminal 268 is coupled to respective second ends of resistors 258 and 262.

Low noise amplifier circuit 200 further includes output terminals 270 and 272 respectively coupled to drains 236 and 244 of MOS transistors M3 230 and M4 238. Output terminal 270 is further coupled to a power terminal 274 through a variable resistance 276. Output terminal 272 is further coupled to a power supply terminal 278 through a variable resistance 280.

Common gate amplifier circuit 202 and common source amplifier circuit 204 are cross-coupled. More particularly, substrate terminal 218 of MOS transistor M1 210 is coupled to source terminal 224 of MOS transistor M2 220, and substrate terminal 228 of MOS transistor M2 220 is coupled to source terminal 214 of MOS transistor M1 210. Further, gate 212 of MOS transistor M1 210 is coupled to source 224 of MOS transistor M2 220 through capacitor 252. Further, gate 222 of MOS transistor M2 220 is coupled to source 214 of MOS transistor M1 210 through capacitor 256.

In one embodiment, low noise amplifier circuit 200 is disposed on a single integrated circuit chip and includes terminals 282 and 284 for connection to off-chip elements. Terminals 282 and 284 are respectively coupled to source terminals 214 and 224 of MOS transistors M1 210 and M2 220. As shown in FIG. 3A, terminal 282 may be coupled to an input terminal 286 for receiving an input voltage signal Vin through a capacitor 288. A high impedance element 290, such as an inductor, may be provided between terminal 282 and ground. Band-stop filter characteristics can be provided by a resonant cavity filter circuit 300, composed of a parallel coupled inductance 302 and capacitance 304, coupled between terminal 284 and ground.

Common gate amplifier circuit 202 can provide broadband impedance matching, while common source amplifier circuit 204 can provide noise elimination functions. Parallel coupling of common source amplifier circuit 204 with common gate amplifier circuit 202 can substantially reduce, and may eliminate, a thermal noise contribution of common gate amplifier circuit 202 to low-noise amplifier circuit 200 and can boost the gain of low-noise amplifier circuit 200. In one exemplary embodiment, the parallel coupling can boost gain by 6 dB.

The resonant frequency of resonant cavity filter circuit 300 can be controlled within the operational band of GSM transmitters (890-915 MHz). In this manner, a low-noise amplifier that originally has an operating band near that of GSM transmitters will have band-stop filter characteristics and effectively reject GSM transmitter interference. The interfering signals are attenuated before they enter the receiving circuit, effectively increasing receiver immunity to interfering signals.

Figure 3B:
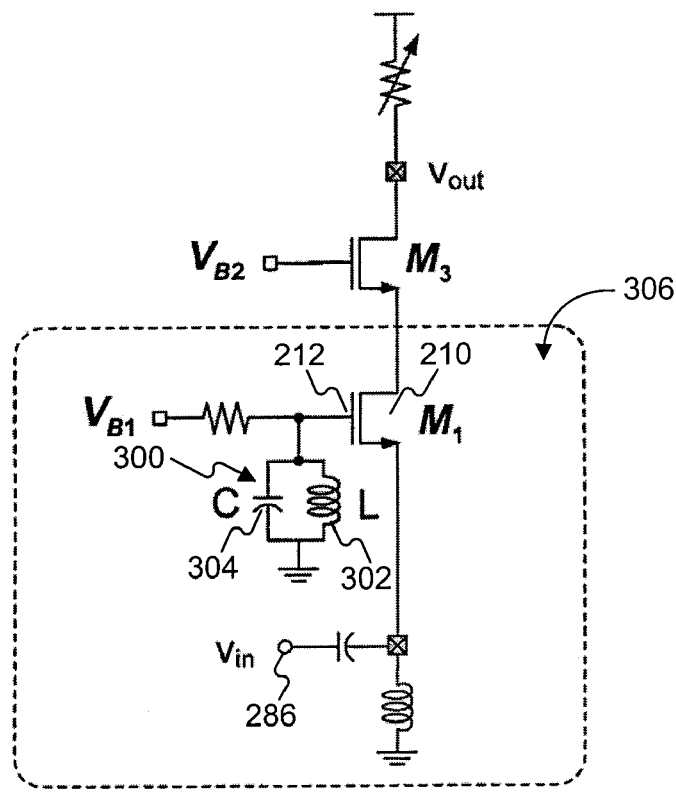
FIG. 3B shows a low-noise amplifier circuit consistent with embodiments of the invention.
Figure 3C:
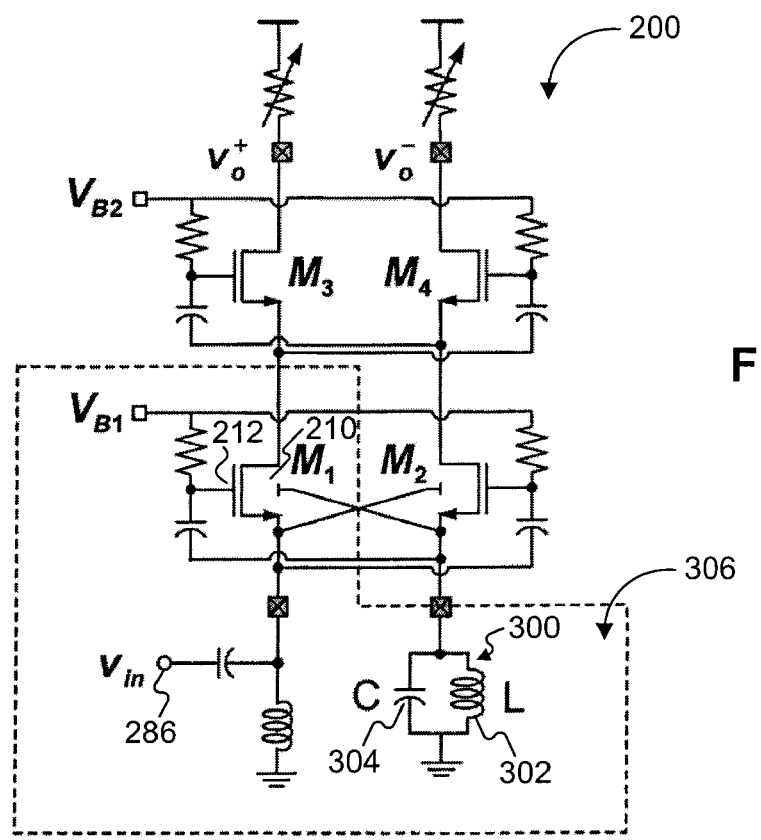
FIG. 3C shows placement of the low-noise amplifier circuit of FIG. 3B within the low-noise amplifier circuit shown in FIG. 3A.

Band-stop filter characteristics present within low-noise amplifier circuit 200 are further explained with reference to FIG. 3B and FIG. 3C. FIG. 3B illustrates a core low-noise amplifier circuit 306 that may exhibit band-stop filter characteristics. As further shown in FIG. 3C discussed below, core circuit 306 embodies the fundamental configuration of common gate amplifier circuit 202 and associated resonant cavity filter circuit 300 within low-noise amplifier circuit 200. Input signals can be applied to core low-noise amplifier circuit 306 on input terminal 286. However, undesirable interference may also enter core low-noise amplifier circuit 306 on input terminal 286. Resonant cavity filter circuit 300, composed of inductance 302 and capacitance 304 coupled in parallel and provided between gate 212 of MOS transistor M1 210 and ground, can resonate at a desired frequency in order to block or reduce interference located at or near the desired frequency. FIG. 3C illustrates implementation of core low-noise amplifier circuit 306 within low-noise amplifier circuit 200. By such implementation, core low-noise amplifier circuit 306 can provide band-stop filter characteristics within low-noise amplifier circuit 200.

Figure 4:
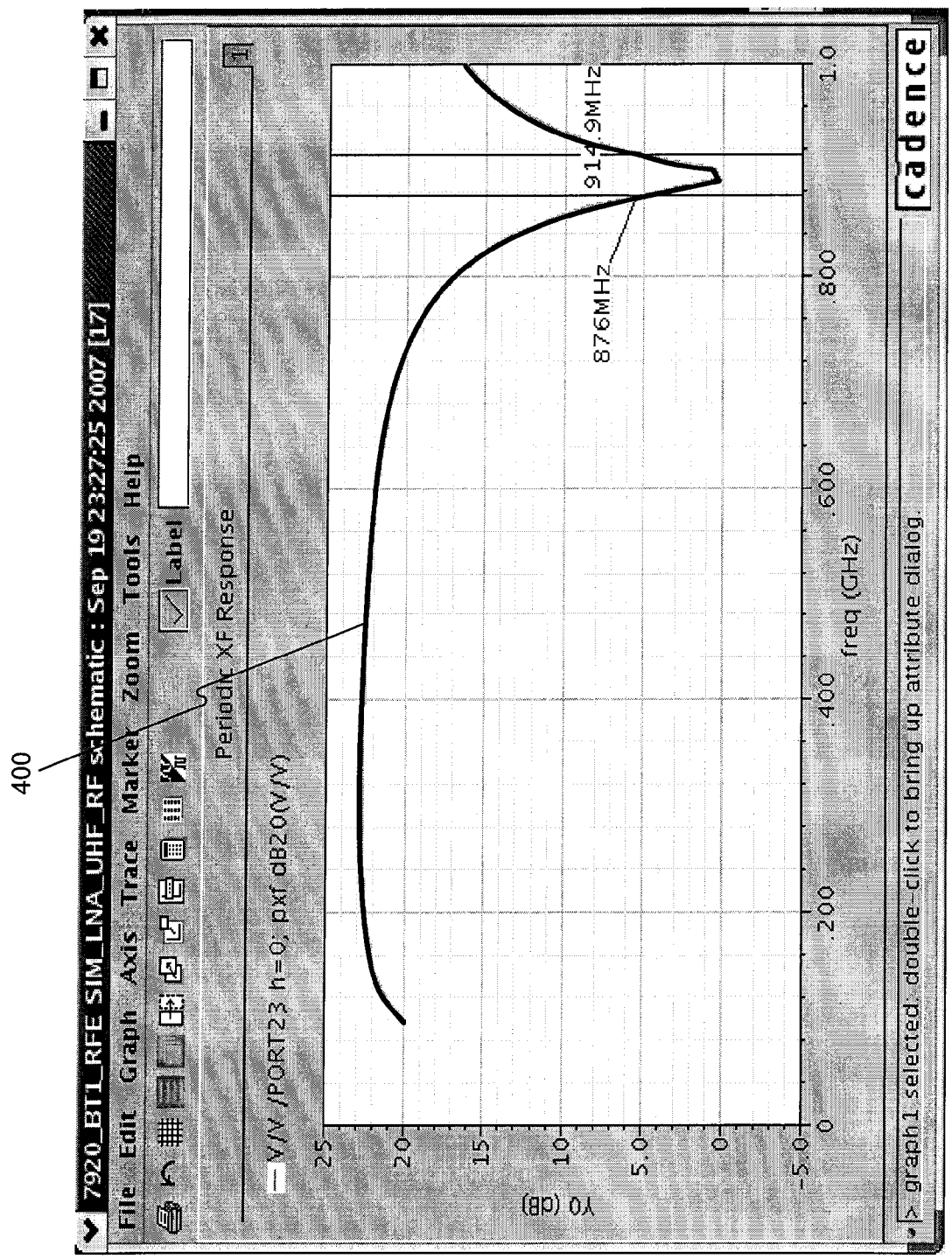
FIG. 4 shows a plot of voltage gain vs. input frequency for a low-noise amplifier configured as shown in FIG. 3A.

FIG. 4 illustrates a voltage conversion curve 400 plotted as voltage gain vs. input frequency that may result from operation of low-noise amplifier circuit 200 configured as shown in FIG. 3A. Voltage conversion curve 400 shows that an extra rejection of more than 20 dB can be achieved in a GSM transmitter interference band, e.g., a band in the range 880-915 MHz, by low-noise amplifier circuit 200, configured as shown in FIG. 3A, including resonant cavity filter circuit 300. In contrast, a low-noise amplifier circuit with identical topology but without resonant cavity filter circuit 300 would not provide the extra rejection. The extra rejection reduces the rejection specification requirements of external RF filters, reduces costs, and increases stable operation of a receiver with which the low-noise amplifier is coupled.

Figure 5:
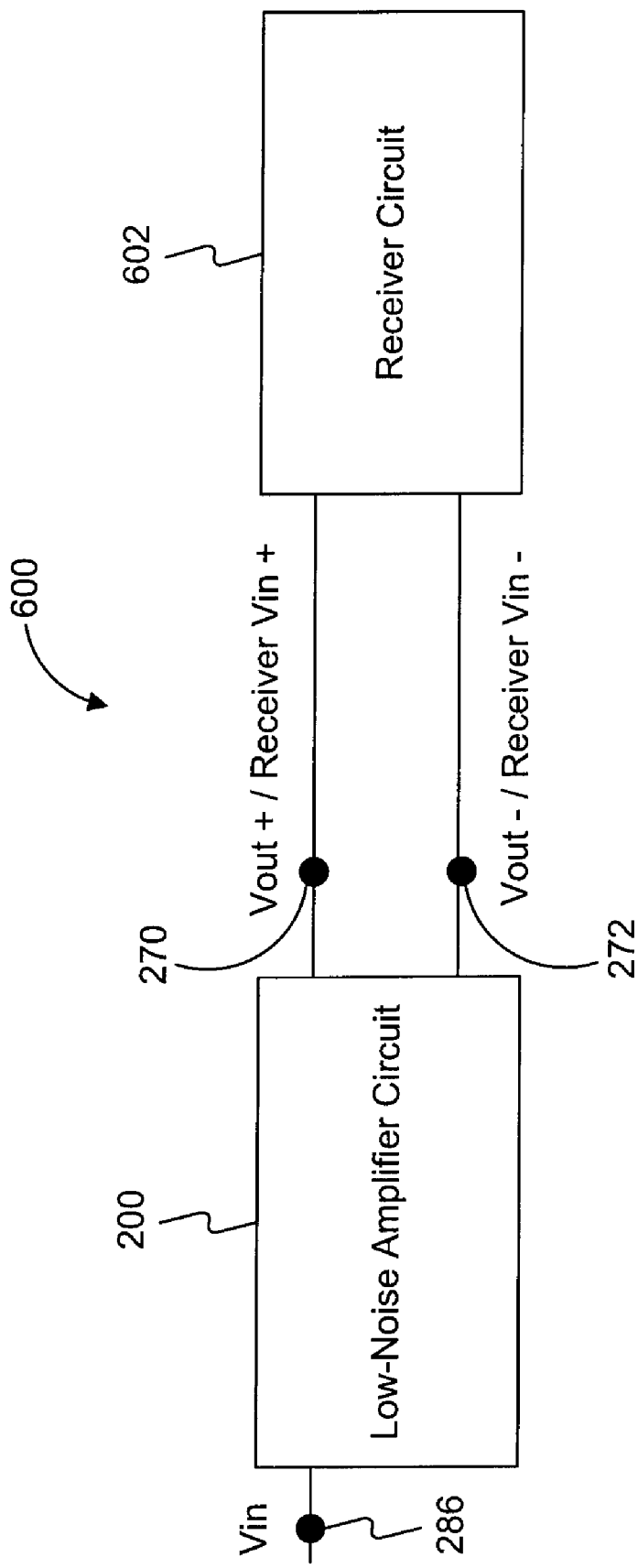
FIG. 5 shows a block diagram of a single-ended input, dual-ended output low-noise amplifier circuit serving as a first stage of a receiver circuit.

FIG. 5 is a block diagram 600 showing an example of how single-ended input, dual-ended output low-noise amplifier circuit 200, consistent with embodiments of the invention, can serve as a first stage of a receiver circuit. Low-noise amplifier circuit 200 includes input terminal 286 for receiving an input voltage signal Vin and two output terminals 270 and 272 for providing differential output signals Vout+ and Vout−, respectively. Voltage signals from the output terminals 270 and 272 of the low-noise amplifier circuit 200 can be provided as differential input signals Vin+ and Vin−, respectively, to a receiver circuit 602.

It will be apparent to those skilled in the art that various modifications and variations can be made in the disclosed structures and methods without departing from the scope or spirit of the invention. Other embodiments of the invention will be apparent to those skilled in the art from consideration of the specification and practice of the invention disclosed herein. It is intended that the specification and examples be considered exemplary only, with a true scope and spirit of the invention being indicated by the following claims.

What is claimed is:

1. A low-noise amplifier circuit to convert a single-ended input into a dual-ended output, comprising:
    a first amplifier circuit, including a first MOS transistor in a common gate amplifier configuration coupled in parallel with a second MOS transistor;
    a second amplifier circuit, including a third MOS transistor connected in parallel with a fourth MOS transistor;
    each of the first, second, third, and fourth transistors having a gate, a source, and a drain;
    the first amplifier circuit and the second amplifier circuit being cascode coupled to form a cascode amplifier configuration;
    the source of the first transistor serving as the single-ended input;
    the dual-ended output being a differential output across the drain of the third transistor and the drain of the fourth transistor; and
    a resonant cavity filter circuit coupled to the gate of the first transistor.

2. The low-noise amplifier circuit of claim 1, further including a capacitance coupled between the resonant cavity filter circuit and the gate of the first transistor.

3. The low-noise amplifier circuit of claim 1, wherein the resonant cavity filter circuit comprises an inductance and a capacitance coupled in parallel.

4. The low-noise amplifier circuit of claim 1, wherein the low-noise amplifier circuit comprises a first stage of a system for receiving an input signal.

5. A low-noise amplifier circuit to convert a single-ended input into a dual-ended output, comprising:
   a first amplifier circuit, including a first MOS transistor in a common gate amplifier configuration coupled in parallel with a second MOS transistor;
   a second amplifier circuit, including a third MOS transistor coupled in parallel with a fourth MOS transistor;
   each of the first, second, third, and fourth transistors having a body, gate, source, and drain;
   the first amplifier circuit and the second amplifier circuit being cascode coupled to form a cascode amplifier configuration;
   the single-ended input being at the source of the first transistor;
   the dual-ended output being a differential output across the drain of the third transistor and the drain of the fourth transistor;
   the first and second transistors of the first amplifier circuit being cross-coupled, wherein the body of the first transistor is coupled to the source of the second transistor, and the body of the second transistor is coupled to the source of the first transistor;
   the third and fourth transistors of the second amplifier circuit being cross-coupled, wherein a first capacitance is coupled between the gate of the third transistor and the source of the fourth transistor, and a second capacitance is coupled between the gate of the fourth transistor and the source of the third transistor; and
   a resonant cavity filter circuit coupled to the gate of the first transistor.

6. The low-noise amplifier circuit of claim 5, further comprising:
   a first resistance coupled between the gate of the first transistor and a terminal for receiving a first bias voltage;
   a second resistance coupled between the gate of the second transistor and a terminal for receiving the first bias voltage;
   a third resistance coupled between the gate of the third transistor and a terminal for receiving a second bias voltage;
   a fourth resistance coupled between the gate of the fourth transistor and a terminal for receiving the second bias voltage;
   a first impedance circuit coupled between the drain of the third transistor and a power source terminal;
   a second impedance circuit coupled between the drain of the fourth transistor and the power source terminal; and
   a third impedance circuit coupled between the source of the first transistor and a ground terminal.

7. The low-noise amplifier circuit of claim 5, further comprising a third capacitance coupled between the gate of the first transistor and the source of the second transistor, and a fourth capacitance coupled between the gate of the second transistor and the source of the first transistor.

8. The low-noise amplifier circuit of claim 5, further including a third capacitance coupled between the resonant cavity filter circuit and the gate of the first transistor.

9. The low-noise amplifier circuit of claim 5, wherein the resonant cavity filter circuit comprises an inductance and a third capacitance coupled in parallel.

10. The low-noise amplifier of claim 5, wherein the resonant cavity filter circuit is implemented on-chip.

11. The low-noise amplifier of claim 5, wherein the resonant cavity filter circuit is implemented off-chip.

12. The low-noise amplifier of claim 6, wherein the third impedance circuit comprises an inductance.

13. The low-noise amplifier of claim 6, wherein the third impedance circuit comprises a resistance.

14. The low-noise amplifier of claim 6, wherein the third impedance circuit comprises a transistor.

15. The low-noise amplifier of claim 6, wherein the third impedance circuit comprises any combination of an inductance, resistance, and transistor.

16. The low-noise amplifier circuit of claim 5, wherein the low-noise amplifier circuit comprises a first stage of a system for receiving an input signal.

17. A low-noise amplifier circuit to convert a single-ended input into a dual-ended output, comprising:
   a first MOS transistor in a common gate amplifier configuration coupled in parallel with a second MOS transistor;
   each of the first and second transistors having a gate, a source, and a drain;
   the source of the first transistor serving as the single-ended input;
   the dual-ended output being a differential output across the drain of the first transistor and the drain of the second transistor; and
   a resonant cavity filter circuit coupled to the gate of the first transistor.

18. A low-noise amplifier circuit to convert a single-ended input into a dual-ended output, comprising:
   a first MOS transistor in a common gate amplifier configuration coupled in parallel with a second MOS transistor;
   each of the first and second transistors having a gate, source, and drain;
   the single-ended input being at the source of the first transistor;
   the dual-ended output being a differential output across the drain of the first transistor and the drain of the second transistor;
   the first and second transistors being cross-coupled, wherein a first capacitance is coupled between the gate of the first transistor and the source of the second transistor, and a second capacitance is coupled between the gate of the second transistor and the source of the first transistor; and
   a resonant cavity filter circuit coupled to the source of the second transistor.

19. The low-noise amplifier circuit of claim 18, further comprising:
   a first resistance coupled between the gate of the first transistor and a terminal for receiving a first bias voltage;
   a second resistance coupled between the gate of the second transistor and a terminal for receiving the first bias voltage;
   a first impedance circuit coupled between the source of the first transistor and a ground terminal.

20. The low-noise amplifier circuit of claim 18, wherein the resonant cavity filter circuit comprises an inductance and a third capacitance coupled in parallel.

21. The low-noise amplifier of claim 18, wherein the resonant cavity filter circuit is implemented on-chip.

22. The low-noise amplifier of claim 18, wherein the resonant cavity filter circuit is implemented off-chip.

* * * * *